(12) United States Patent
Gando et al.

(10) Patent No.: US 11,092,440 B2
(45) Date of Patent: Aug. 17, 2021

(54) VIBRATION DEVICE AND METHOD FOR CONTROLLING THE SAME

(71) Applicant: Kabushiki Kaisha Toshiba, Tokyo (JP)

(72) Inventors: Ryunosuke Gando, Kanagawa (JP); Tamio Ikehashi, Kanagawa (JP); Etsuji Ogawa, Kanagawa (JP); Tetsuro Itakura, Tokyo (JP); Yohei Hatakeyama, Kanagawa (JP); Yasushi Tomizawa, Tokyo (JP)

(73) Assignee: KABUSHIKIKAISHA TOSHIBA, Tokyo (JP)

( * ) Notice: Subject to any disclaimer, the term of this patent is extended or adjusted under 35 U.S.C. 154(b) by 187 days.

(21) Appl. No.: 16/112,961

(22) Filed: Aug. 27, 2018

(65) Prior Publication Data

US 2019/0204081 A1 Jul. 4, 2019

(30) Foreign Application Priority Data

Jan. 4, 2018 (JP) .............................. JP2018-000252

(51) Int. Cl.
| | |
|---|---|
| *G01C 19/5719* | (2012.01) |
| *B81C 1/00* | (2006.01) |
| *B81B 3/00* | (2006.01) |
| *G01C 19/5726* | (2012.01) |
| *G01C 19/5755* | (2012.01) |

(52) U.S. Cl.
CPC ........ *G01C 19/5719* (2013.01); *B81B 3/0008* (2013.01); *B81C 1/00976* (2013.01); *G01C 19/5726* (2013.01); *G01C 19/5755* (2013.01); *B81B 2201/0242* (2013.01)

(58) Field of Classification Search
CPC ............ G01C 19/5719; G01C 19/5744; G01C 19/5762; B81C 1/00976; B81B 3/0008; B81B 2201/0242; B81B 7/0058
USPC ............... 73/504.02–504.04, 504.12–504.16, 73/514.15, 514.29
See application file for complete search history.

(56) References Cited

U.S. PATENT DOCUMENTS

| | | | |
|---|---|---|---|
| 9,103,673 | B2 | 8/2015 | Swanson et al. |
| 9,715,480 | B1 | 7/2017 | Tally et al. |

(Continued)

FOREIGN PATENT DOCUMENTS

| | | |
|---|---|---|
| JP | 2012-233730 A | 11/2012 |
| JP | 2014-520277 A | 8/2014 |

(Continued)

*Primary Examiner* — Robert R Raevis
(74) *Attorney, Agent, or Firm* — Finnegan, Henderson, Farabow, Garrett & Dunner L.L.P.

(57) ABSTRACT

According to one embodiment, a method for controlling a vibration device includes a movable body capable of vibrating in a first direction, and a catch and release mechanism capable of catching the movable body that freely vibrates in the first direction, by an electrostatic attractive force, and releasing the caught movable body to freely vibrate the movable body in the first direction, wherein in a condition that tc is a time from a rise start time point to a rise end time point of an applied voltage for catching the movable body that freely vibrates in the first direction, by the electrostatic attractive force, and td is a period of the free vibration in the first direction of the movable body, the time tc is longer than the time td.

5 Claims, 8 Drawing Sheets

(56) References Cited

U.S. PATENT DOCUMENTS

| | | |
|---|---|---|
| 2012/0326700 A1 | 12/2012 | Swanson et al. |
| 2014/0166483 A1 | 6/2014 | Chow et al. |
| 2014/0227816 A1* | 8/2014 | Zhang ................ B81C 1/00333 438/48 |
| 2014/0305213 A1 | 10/2014 | Swanson et al. |
| 2016/0072408 A1 | 3/2016 | Khieu et al. |
| 2016/0298966 A1 | 10/2016 | Ikehashi |
| 2016/0299873 A1 | 10/2016 | Tally et al. |
| 2017/0268878 A1 | 9/2017 | Yamamoto et al. |

FOREIGN PATENT DOCUMENTS

| | | |
|---|---|---|
| JP | 2016-520257 A | 7/2016 |
| JP | 2016-200512 A | 12/2016 |
| JP | 2017-166974 A | 9/2017 |

* cited by examiner

VIBRATION DEVICE AND METHOD FOR CONTROLLING THE SAME

CROSS-REFERENCE TO RELATED APPLICATIONS

This application is based upon and claims the benefit of priority from Japanese Patent Application No. 2018-000252, filed Jan. 4, 2018, the entire contents of which are incorporated herein by reference.

FIELD

Embodiments described herein relate generally to a vibration device and a method for controlling the vibration device.

BACKGROUND

Vibration devices using a micro-electromechanical systems (MEMS) technique have been proposed. The vibration devices catch a movable body that freely vibrates, by an electrostatic attractive force, release the caught movable body, and freely vibrate the movable body.

However, in the above-described vibration devices, when the movable body is caught, mechanical contact occurs between the movable body and a catch and release mechanism, and foreign matter may be generated. If the foreign matter adheres to the movable body or the catch and release mechanism, a proper catching operation may be hindered.

Therefore, there has been a demand for a vibration device and a method for controlling the vibration device that can suppress the generation of foreign matter.

DETAILED DESCRIPTION

In general, according to one embodiment, a method for controlling a vibration device includes: a movable body capable of vibrating in a first direction; and a catch and release mechanism capable of catching the movable body that freely vibrates in the first direction, by an electrostatic attractive force, and releasing the caught movable body to freely vibrate the movable body in the first direction, wherein in a condition that tc is a time from a rise start time point to a rise end time point of an applied voltage for catching the movable body that freely vibrates in the first direction, by the electrostatic attractive force, and td is a period of the free vibration in the first direction of the movable body, the time tc is longer than the time td.

Hereinafter, an embodiment will be described with reference to the drawings.

Figure 1:
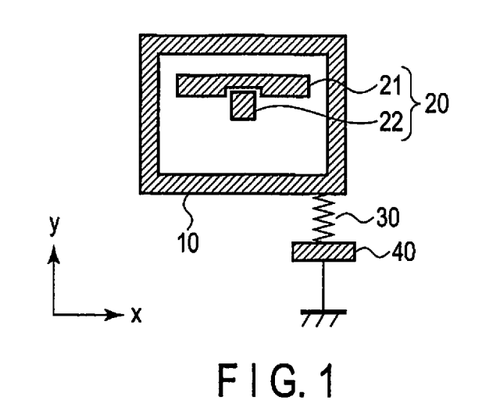
FIG. 1 is a view schematically illustrating the principle configuration of a vibration device according to an embodiment.

FIG. 1 is a view schematically illustrating the principle configuration of a vibration device according to the present embodiment.

The vibration device illustrated in FIG. 1 includes a movable body 10, a catch and release mechanism 20, a spring 30, and an anchor 40.

The movable body 10 can freely vibrate in the y direction (first direction) by the spring 30 fixed to the anchor 40.

The catch and release mechanism 20 can catch the movable body 10 that freely vibrates in the y direction, by an electrostatic attractive force, release the caught movable body 10, and freely vibrate the movable body 10 in the y direction.

Figure 2:
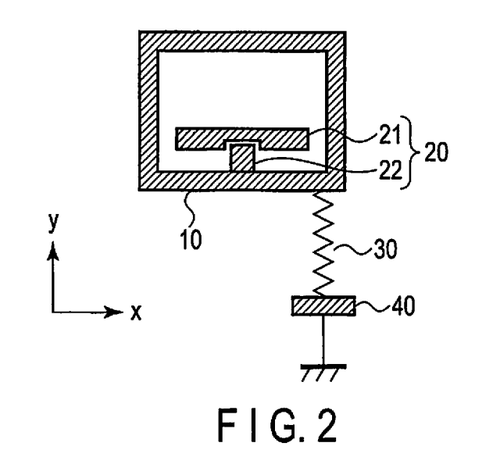
FIG. 2 is a view schematically illustrating a movable body caught by a catch and release mechanism in the vibration device according to the embodiment.

The catch and release mechanism 20 includes an electrode 21 and a stopper 22. By applying a voltage to the electrode 21, an electrostatic attractive force is applied to the movable body 10 that freely vibrates in the y direction. Since the stopper 22 is positioned in front of the electrode 21, the movable body 10 comes into contact with the stopper 22, so that the vibration of the movable body 10 stops. That is, as illustrated in FIG. 2, the movable body 10 is caught by the catch and release mechanism 20 by the action of the electrode 21 and the stopper 22. By stopping the application of the voltage to the electrode 21, the movable body 10 is released from the catch and release mechanism 20, and the free vibration of the movable body 10 starts.

Figure 3:
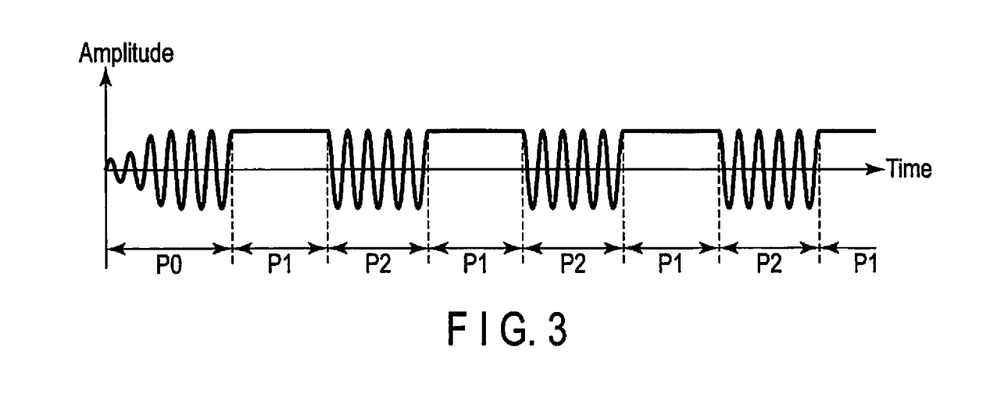
FIG. 3 is a timing chart illustrating a catch and release operation in the vibration device according to the embodiment.

FIG. 3 is a timing chart illustrating the catch and release operation described above. A period P0 is a vibration start period of the movable body 10, a period P1 is a period during the movable body 10 is caught by the catch and release mechanism 20, and a period P2 is a period during the movable body 10 freely vibrates after release from the catch and release mechanism 20. By providing the catch and release mechanism 20 in this manner, it is possible to repeatedly perform the vibration operation with low power consumption.

However, in the above-described vibration device, when the movable body 10 is caught, mechanical contact occurs between the movable body 10 and the catch and release mechanism 20, and foreign matter may be generated. If the foreign matter adheres to the movable body 10 or the catch and release mechanism 20, a proper catching operation may be hindered. Specifically, the distance between the movable body 10 and the electrode 21 of the catch and release mechanism 20 is changed by the foreign matter, which may hinder the proper catching operation. Therefore, it is important to suppress the generation of such foreign matter. In the present embodiment, the generation of foreign matter is suppressed as follows.

Figure 4:
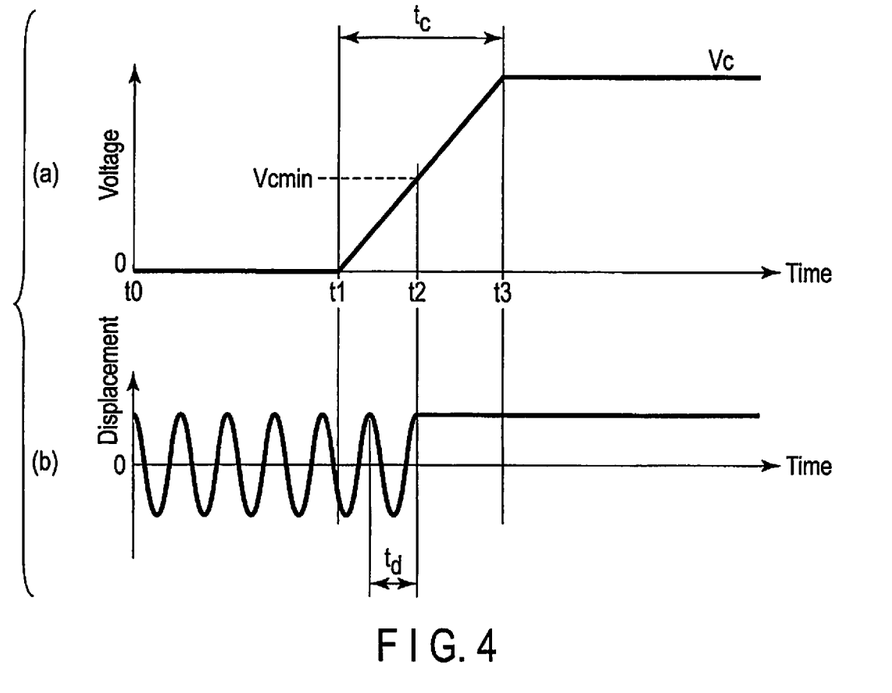
FIG. 4 is graphs illustrating the principle of a method for controlling the vibration device according to the embodiment.

FIG. 4 is a graph illustrating the principle of a method for controlling the vibration device according to the present embodiment. FIG. 4(a) illustrates a voltage applied between the movable body 10 and the electrode 21 of the catch and release mechanism 20. FIG. 4(b) illustrates displacement in the y direction of the movable body 10.

Figure 10:
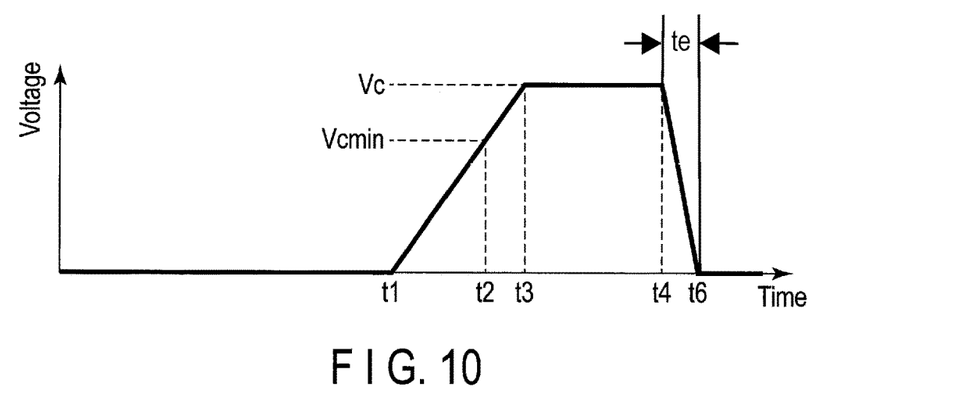
FIG. 10 is a graph schematically illustrating a fifth example of the rise and fall waveform of the applied voltage according to the embodiment.

From a time t0 to a time t2, the movable body 10 freely vibrates in the y direction. At a time t1, voltage application starts between the movable body 10 and the electrode 21 of the catch and release mechanism 20. In this voltage application, control is performed so that a predetermined time or longer is given from the rise start time point t1 to the rise end time point t3 of an applied voltage. Specifically, in a condition that tc is the time from the rise start time point t1 to the rise end time point t3 of an applied voltage for catching the movable body 10 by an electrostatic attractive force, and td is the period of the free vibration in the y direction of the movable body 10, control is performed so that the time tc becomes longer than the time td. Furthermore, in a condition that te (as shown in FIG. 10) is the time from the fall start time point to the fall end time point of an applied voltage for releasing the movable body 10 caught by the catch and release mechanism 20 and freely vibrating the movable body 10 in the y direction, control is performed so that the time tc becomes longer than the time te or becomes equal to the time te.

From another point of view, in a condition that Vcim is the minimum voltage necessary for catching the movable body 10 that freely vibrates in the y direction, by an electrostatic attractive force, td is the period of the free vibration in the y direction of the movable body 10, and ΔV/Δt is the increase rate of the applied voltage at the moment when the minimum voltage Vcmin is applied between the catch and release mechanism 20 and the movable body 10, control is performed so that ΔV/Δt becomes smaller than Vcmin/td. Normally, the minimum voltage Vcmin is defined when the movable body 10 comes closest to the catch and release mechanism 20 during free vibration, that is, when the movable body 10 is positioned at the peak position of the free vibration. Furthermore, in a condition that Vc is the voltage applied to the movable body 10 when the movable body 10 is caught by the catch and release mechanism 20, and te is the time from the fall start time point to the fall end time point of the applied voltage for releasing the movable body 10 caught by the catch and release mechanism 20 and freely vibrating the movable body 10 in the y direction, control is performed so that ΔV/Δt becomes smaller than Vc/te or becomes equal to Vc/te.

By performing the applied voltage control such as described above, it is possible to reduce collision speed when the movable body 10 collides with the stopper 22 of the catch and release mechanism 20. Thereby, it is possible to alleviate impact due to the collision, and it is possible to suppress the generation of foreign matter. As a result, it is possible to suppress change in the distance between the movable body 10 and the electrode 21 due to foreign matter, and to perform a proper catching operation.

Figure 5:
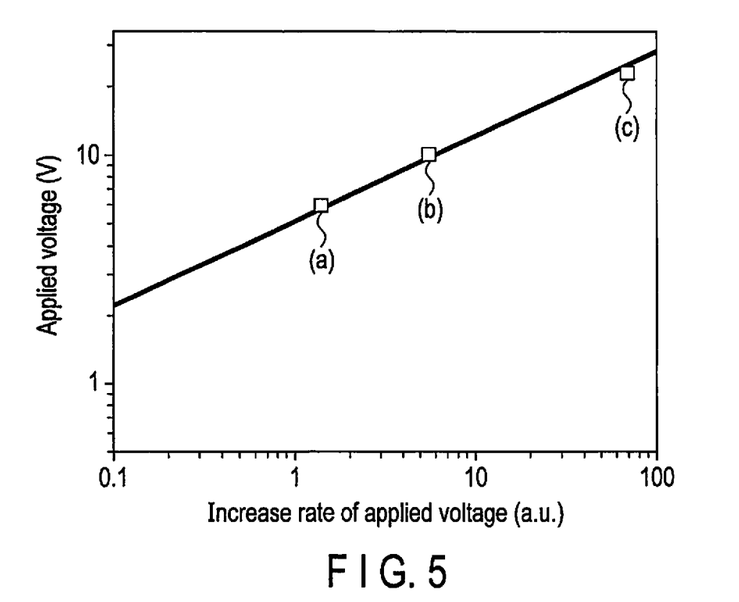
FIG. 5 is a graph illustrating a measurement result of the relationship between an increase rate of an applied voltage and an applied voltage necessary for catch.

FIG. 5 is a graph illustrating a measurement result of the relationship between an increase rate (dV/dt) of an applied voltage and an applied voltage necessary for catch. This is the measurement result after one million catch and release operations. (a) indicates a case where dV/dt=14V/ms, (b) indicates a case where dV/dt=56V/ms, and (c) indicates a case where dV/dt=infinity. By lowering the increase rate (dV/dt) of the applied voltage, the applied voltage necessary for catch is reduced. This is because the generation of foreign matter is suppressed by lowering the increase rate (dV/dt) of the applied voltage.

FIGS. 6 to 11 are graphs schematically illustrating various examples of the rise and fall waveform of the applied voltage.

Figure 6:
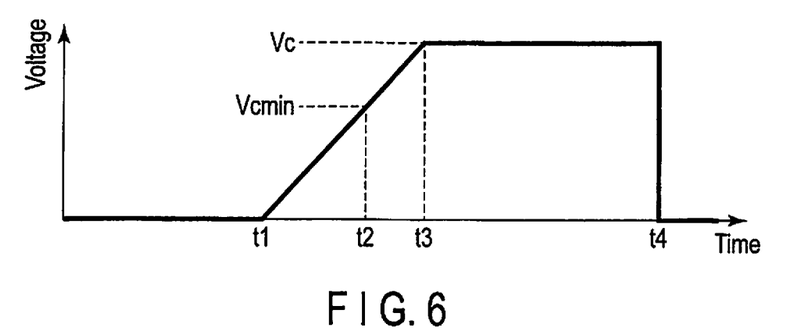
FIG. 6 is a graph schematically illustrating a first example of a rise and fall waveform of an applied voltage according to the embodiment.

FIG. 6 is a first waveform example of the applied voltage, which is basically similar to the waveform example illustrated in FIG. 4. That is, the voltage rises at a constant increase rate (dV/dt) from the rise start time point t1 to the rise end time point t3 of the applied voltage, and the applied voltage remains at Vc for a certain period from the rise end time point t3 (from t3 to t4).

Figure 7:
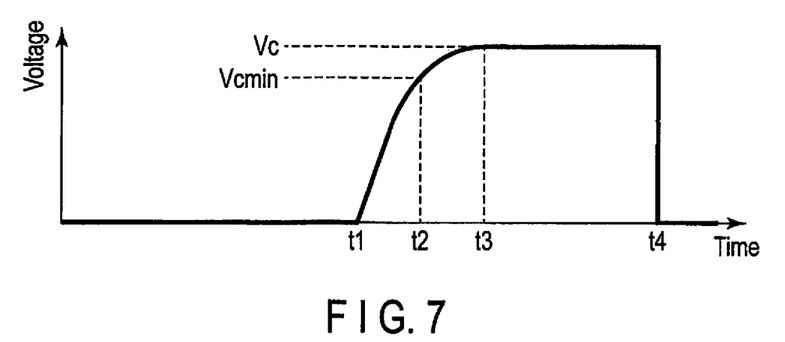
FIG. 7 is a graph schematically illustrating a second example of the rise and fall waveform of the applied voltage according to the embodiment.

FIG. 7 is a second waveform example of the applied voltage. In the second waveform example, a voltage is applied so that the voltage increase rate (dV/dt) gradually decreases from the rise start time point t1 to the rise end time point t3 of the applied voltage, and the applied voltage remains at Vc for the certain period from the rise end time point t3 (from t3 to t4).

Figure 8:
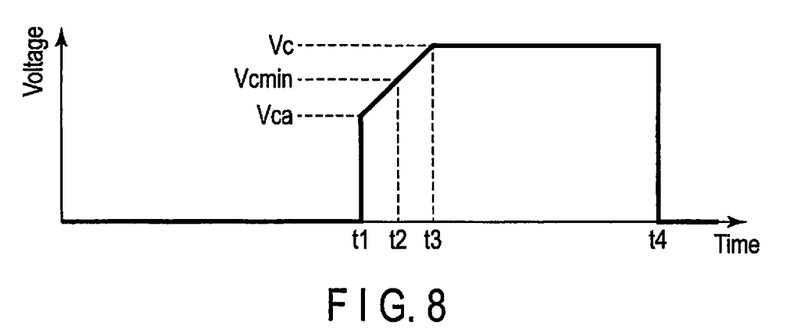
FIG. 8 is a graph schematically illustrating a third example of the rise and fall waveform of the applied voltage according to the embodiment.

FIG. 8 is a third waveform example of the applied voltage. In the third waveform example, the applied voltage is momentarily increased to Vca at the rise start time point t1, and thereafter the applied voltage is increased at a predetermined increase rate to the rise end time point t3. At the time when Vca is applied, the movable body 10 does not come into contact with the stopper 22 of the catch and release mechanism 20, and the movable body 10 comes into contact with the stopper 22 at the time t2 (voltage Vcmin). By performing such control, the movable body 10 can be caught by the catch and release mechanism 20 in a relatively short time.

Figure 9:
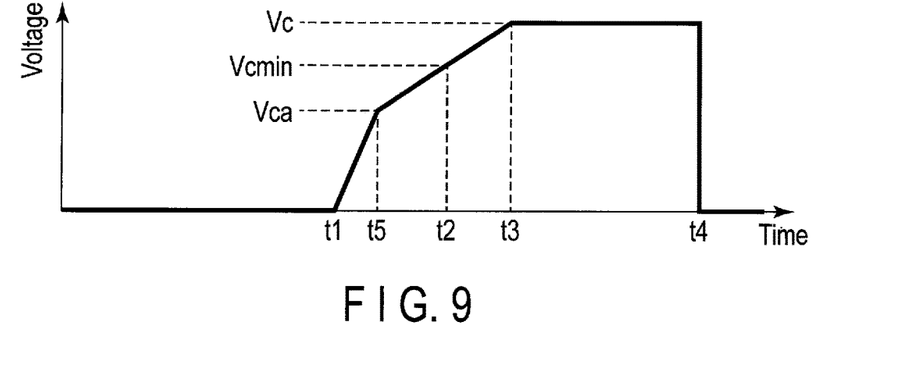
FIG. 9 is a graph schematically illustrating a fourth example of the rise and fall waveform of the applied voltage according to the embodiment.

FIG. 9 is a fourth waveform example of the applied voltage. The fourth waveform example is also similar to the above-described third waveform example. However, in the fourth waveform example, the applied voltage is increased at a first voltage increase rate from the time t1 to the time t5, and from the time t5 to the time t3, the applied voltage is increased at a second voltage increase rate lower than the first voltage increase rate.

FIG. 10 is a fifth waveform example of the applied voltage. In the fifth waveform example, a constant time is provided for the fall of the applied voltage. That is, the fall starts at the time t4 and the fall ends at a time t6. In this example, the rise time (t3–t1) is longer than the fall time (t6–t4). That is, the voltage increase rate at the rise is smaller than the voltage decrease rate at the fall. However, the rise time (t3–t1) may be the same as the fall time (t6–t4).

Figure 11:
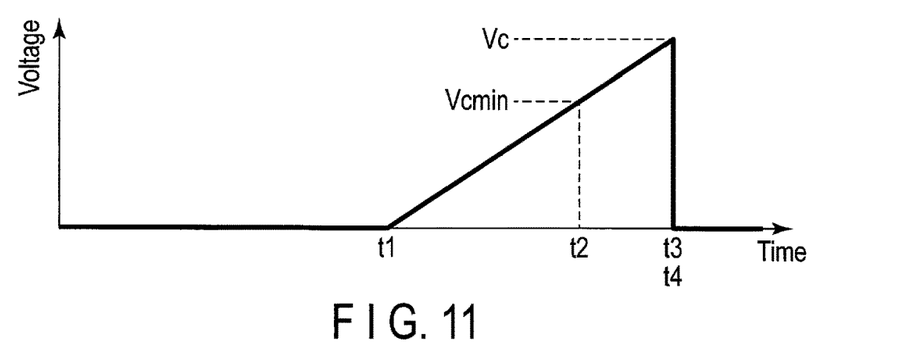
FIG. 11 is a graph schematically illustrating a sixth example of the rise and fall waveform of the applied voltage according to the embodiment.

FIG. 11 is a sixth waveform example of the applied voltage. In the sixth waveform example, the applied voltage is momentarily dropped at the rise end time point t3 of the applied voltage.

Next, a voltage application circuit of the vibration device according to the present embodiment will be described. The voltage application circuit is configured to give a time equal to or longer than a predetermined time from the rise start time point t1 to the rise end time point t3 of the applied voltage for catching the movable body 10 by an electrostatic attractive force. The predetermined time is longer than the period td of the free vibration in the y direction of movable body 10.

Figure 12:
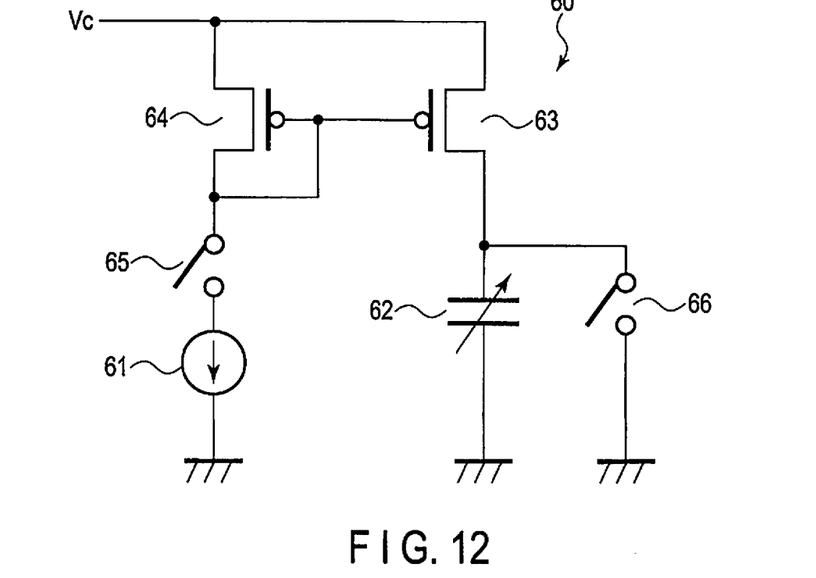
FIG. 12 is an electric circuit diagram illustrating a first configuration example of a voltage application circuit according to the embodiment.

FIG. 12 is an electric circuit diagram illustrating a first configuration example of the voltage application circuit 60. By the voltage application circuit 60 in FIG. 12, an applied voltage waveform such as illustrated in FIGS. 4 and 6 is obtained.

The voltage application circuit 60 includes a constant current source 61 and a charging circuit 63 for charging the variable capacitor 62 with a current based on the constant current source 61. The charging circuit 63 includes a metal-oxide-semiconductor (MOS) transistor. The variable capacitor 62 includes the movable body 10 and the catch and release mechanism 20 already described. That is, when the movable body 10 vibrates, the distance between the movable body 10 and the electrode 21 of the catch and release mechanism 20 changes. Since capacitance varies with the change in the distance, the movable body 10 and the catch and release mechanism 20 constitute the variable capacitor 62. A MOS transistor (first transistor) 64 is connected in series to the constant current source 61, and a MOS transistor (second transistor) 63 is connected in parallel to the MOS transistor 64. A first series circuit including the MOS transistor 64 and the constant current source 61 and a second series circuit including the MOS transistor 63 and the variable capacitor 62 constitute a current mirror circuit.

The operation of the voltage application circuit 60 in FIG. 12 will be described with reference to FIG. 6. Until the time t1, a switch 65 is set in an OFF state and a switch 66 is set in an ON state. At the time t1, the switch 65 is set in the ON state and the switch 66 is set in the OFF state. As a result, the variable capacitor 62 is charged at a constant speed by the action of the current mirror circuit. At the time t4, the switch 65 is set in the OFF state and the switch 66 is set in the ON state. As a result, the variable capacitor 62 is momentarily discharged. As described above, an applied voltage waveform such as illustrated in FIG. 6 is obtained.

Figure 13:
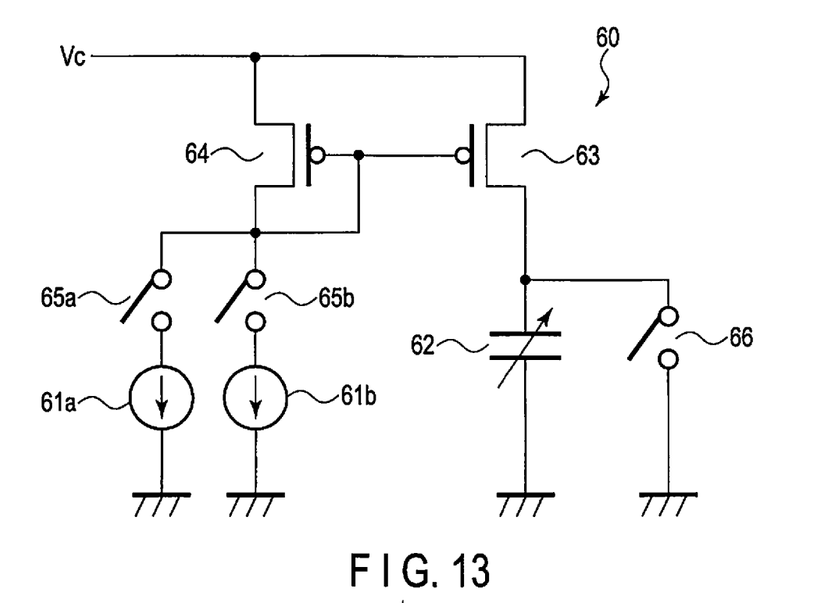
FIG. 13 is an electric circuit diagram illustrating a second configuration example of the voltage application circuit according to the embodiment.

FIG. 13 is an electric circuit diagram illustrating a second configuration example of the voltage application circuit 60. By the voltage application circuit 60 in FIG. 13, an applied voltage waveform such as illustrated in FIG. 9 is obtained. Note that, since this configuration example is similar to the above-described first configuration example, the descriptions of the items described in the first configuration example is not given.

The voltage application circuit 60 includes a constant current source 61a, a constant current source 61b, and the charging circuit 63 for charging the variable capacitor 62 with currents based on the constant current sources 61a and 61b. The charging circuit 63 includes the MOS transistor. The current amount of the constant current source 61a is larger than the current amount of the constant current source 61b. The MOS transistor 64 is connected in series to the constant current source 61a and the constant current source 61b, and the MOS transistor 63 is connected in parallel to the MOS transistor 64. The first series circuit including the MOS transistor 64 and the constant current source 61a (or the constant current source 61b) and the second series circuit including the MOS transistor 63 and the variable capacitor 62 constitute a current mirror circuit.

The operation of the voltage application circuit 60 in FIG. 13 will be described with reference to FIG. 9. Until the time t1, the switch 65a and the switch 65b are set in the OFF state and the switch 66 is set in the ON state. From the time t1 to the time t5, the switch 65a is set in the ON state, the switch 65b is set in the OFF state, and the switch 66 is set in the OFF state. From the time t5 to the time t3, the switch 65a is set in the OFF state, the switch 65b is set in the ON state, and the switch 66 is set in the OFF state. After the time t4, the switches 65a and 65b are set in the OFF state and the switch 66 is set in the ON state. In this way, an applied voltage waveform such as illustrated in FIG. 9 is obtained.

Figure 14:
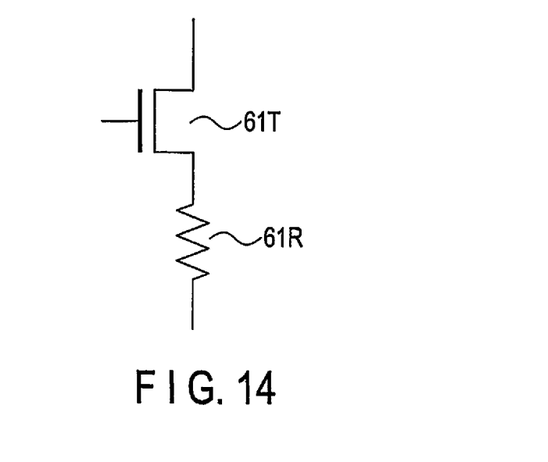
FIG. 14 is an electric circuit diagram illustrating a specific configuration of a constant current source in the first configuration example and the second configuration example of the voltage application circuit according to the embodiment.

FIG. 14 is an electric circuit diagram illustrating specific configurations of the constant current sources 61, 61a, and 61b described in the first configuration example (FIG. 12) and the second configuration example (FIG. 13) above described. As illustrated in FIG. 14, a MOS transistor 61T and a resistance element 61R can constitute the constant current sources 61, 61a, or 61b.

Figure 15:
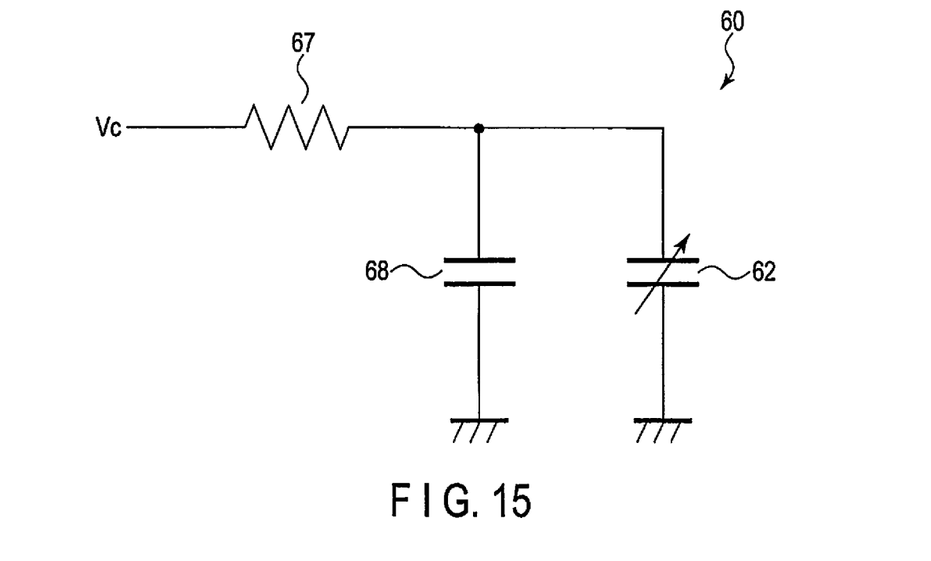
FIG. 15 is an electric circuit diagram illustrating a third configuration example of the voltage application circuit according to the embodiment.

FIG. 15 is an electric circuit diagram illustrating a third configuration example of the voltage application circuit 60. By the voltage application circuit 60 in FIG. 15, an applied voltage waveform such as shown in FIG. 7 is obtained. In this configuration example, a resistance element 67 is connected in series to the variable capacitor 62, and a capacitor element 68 is connected in parallel to the variable capacitor 62. The resistance element 67 and the capacitor element 68 constitute a time constant circuit, and the variable capacitor 62 is charged based on a time constant of the time constant circuit.

Next, a gyro sensor using the vibration device and the method for controlling the vibration device that are above described will be described.

Figure 16:
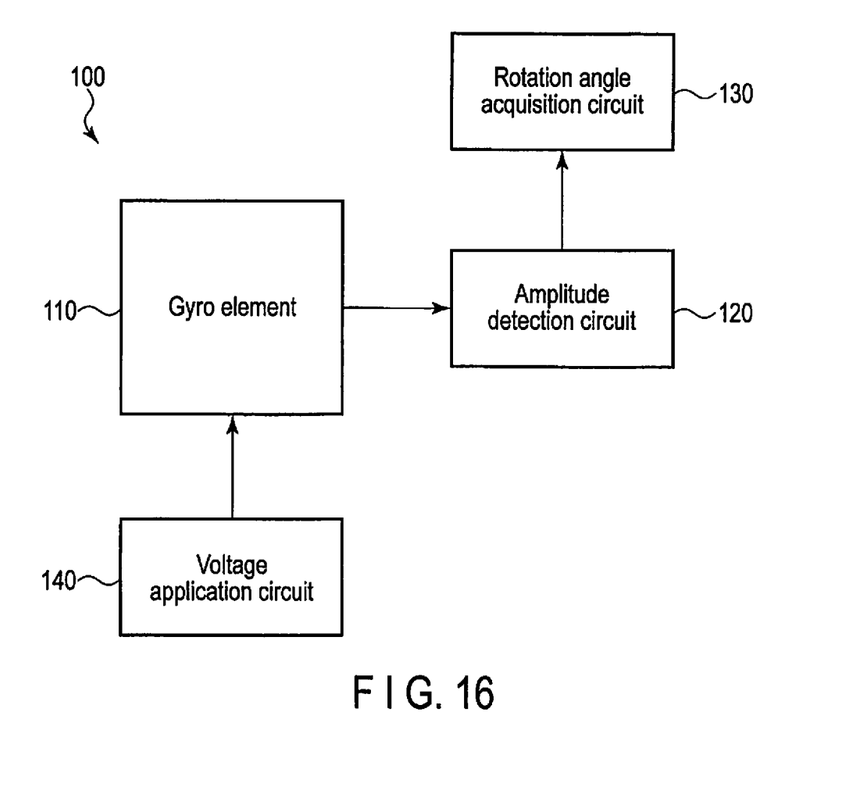
FIG. 16 is a block diagram illustrating a basic configuration of a gyro sensor system according to the embodiment.

FIG. 16 is a block diagram illustrating a basic configuration of the gyro sensor system according to the present embodiment.

Figure 17:
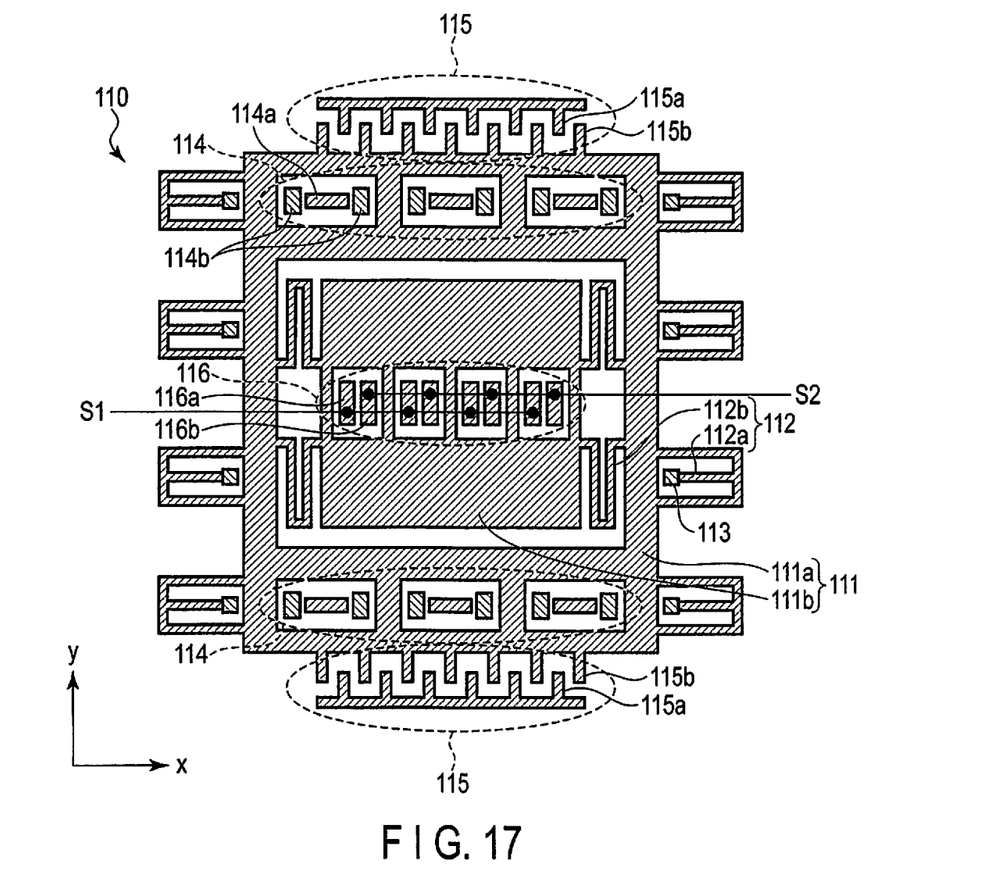
FIG. 17 is a plan view schematically illustrating a configuration of a gyro element in the gyro sensor system according to the embodiment.

FIG. 17 is a plan view schematically illustrating a configuration of a gyro element in the gyro sensor system according to the present embodiment. The gyro element is formed on a substrate by using a micro-electromechanical systems (MEMS) technique.

As shown in FIG. 16, a gyro sensor system 100 includes a gyro element (MEMS element) 110, an amplitude detection circuit 120, a rotation angle acquisition circuit 130, and a voltage application circuit 140. The voltage application circuit 140 corresponds to the voltage application circuit 60 described above.

As shown in FIG. 17, the gyro element (MEMS element) 110 includes a movable body 111, a spring mechanism 112, an anchor 113, a catch and release mechanism 114, a drive and monitor mechanism 115, and a detection mechanism 116. The movable body 111 corresponds to the above-described movable body 10, and the catch and release mechanism 114 corresponds to the above-described catch and release mechanism 20.

The movable body 111 includes a movable portion (movable mass) 111a and a movable portion (movable mass) 111b, and can vibrate in the y direction (first direction) and the x direction (second direction) perpendicular to the y direction. The movable portion 111a is a movable portion for driving, and can vibrate mainly in the y direction (first direction). The movable portion 111b is a movable portion for sensing, and can vibrate mainly in the x direction (second direction).

The spring mechanism 112 includes a spring 112a and a spring 112b, and vibrates the movable body 111 in the y direction and the x direction. The spring 112a is coupled to the movable portion 111a, and is provided mainly for vibrating the movable portion 111a in the y direction. The spring 112b is coupled to the movable portion 111a and the movable portion 111b, and is provided mainly for vibrating the movable portion 111b in the x direction. In the example illustrated in FIG. 17, the spring mechanism 112 includes eight springs 112a and four springs 112b. When a rotational motion is applied to the movable body 111 that freely vibrates in the y direction by the spring mechanism 112, a Coriolis force acts on the movable body 111, and the movable body 111 vibrates in the x direction.

The anchor 113 is provided to support the spring 112a, and is fixed to an under region. In the example shown in FIG. 17, eight anchors 113 are provided corresponding to the eight springs 112a.

The catch and release mechanism 114 has a function of catching the movable body 111 and releasing the caught movable body 111 to freely vibrate the movable body 111 in the y direction. The catch and release mechanism 114 includes an electrode 114a and a stopper 114b. By applying a predetermined voltage between the electrode 114a and the movable body 111, an electrostatic attractive force acts between the electrode 114a and the movable body 111. As a result, the movable body 111 stops with being in contact with the stopper 114b, and the movable body 111 is caught by the catch and release mechanism 114. By decreasing the voltage applied between the electrode 114a and the movable body 111 to reduce the electrostatic attractive force, the movable body 111 is released from the catch and release mechanism 114, and the movable body 111 starts free vibration in the y direction.

The drive and monitor mechanism 115 includes an electrode 115a and an electrode 115b, and has a drive function and a monitor function for the movable body 111. The drive function is a function for forcibly driving the movable body 111 in an initial state immediately after turning on the power supply of the gyro sensor system. That is, in the initial state immediately after the power supply is turned on, the movable body 111 is not caught by the catch and release mechanism 114. In such an initial state, by applying a predetermined voltage between the electrode 115a and the electrode 115b, an electrostatic attractive force acts between the electrode 115a and the electrode 115b. As a result, the movable body 111 is driven, and the movable body 111 can be caught by the catch and release mechanism 114. The monitor function is a function for monitoring the position in the y direction of the movable body 111 that vibrates in the y direction. By detecting capacitance between the electrode 115a and the electrode 115b, the position in the y direction of the movable body 111 can be monitored. In the example illustrated in FIG. 17, two drive and monitor mechanisms 115 are provided, and the drive and monitor mechanism 115 on one side can be used for driving and the drive and monitor mechanism 115 on the other side can be used for monitoring.

In a detection unit including the detection mechanism 116 and the amplitude detection circuit 120 (see FIG. 1), the amplitude of vibration in the x direction of the movable body 111 based on the Coriolis force acting on the movable body 111 that freely vibrates in the y direction by the spring mechanism 112 is detected. The detection mechanism 116 and the amplitude detection circuit 120 will be additionally described below.

The detection mechanism 116 detects a predetermined physical quantity based on the amplitude of the vibration in the x direction of the movable body 111, and includes an electrode 116a and an electrode 116b. In the present embodiment, the predetermined physical quantity is a physical quantity based on capacitance Ca between the electrode 116a and the movable body 111 and capacitance Cb between the electrode 116b and the movable body 111. As already described above, when the rotational motion is applied to the movable body 111 that freely vibrates in the y direction, the Coriolis force acts on the movable body 111, and the movable body 111 vibrates in the x direction. As a result, the above-described capacitances Ca and Cb change according to the vibration. Since the electrode 116a and the electrode 116b are fixed to the under region, when one of the capacitances Ca and Cb increases due to the vibration in the x direction of the movable body 111, the other of the capacitances Ca and Cb decreases.

The amplitude detection circuit 120 illustrated in FIG. 16 is connected to the electrode 116a and the electrode 116b of the detection mechanism 116. In the amplitude detection circuit 120, the amplitude of the vibration in the x direction of the movable body 111 is detected based on the predetermined physical quantity (capacitances Ca and Cb) detected by the detection mechanism 116. As already described, as one of the capacitances Ca and Cb increases, the other of the capacitances Ca and Cb decreases. Therefore, in the amplitude detection circuit 120, it is possible to detect the amplitude of the vibration in the x direction of the movable body 111, based on a difference between the capacitance Ca and the capacitance Cb.

The rotation angle acquisition circuit (rotation angle acquisition unit) 130 acquires (calculates) the rotation angle of the movable body 111, based on the amplitude of the vibration in the x direction of the movable body 111. Specifically, the angular velocity of the movable body 111 is calculated based on the amplitude of the vibration in the x direction of the movable body 111, and the rotation angle of the movable body 111 is calculated based on the calculated angular velocity.

The voltage application circuit 140 has a function similar to that of the voltage application circuit 60 already described. That is, when the movable body 111 is caught by the catch and release mechanism 114, a voltage is applied between the electrode 114a and the movable body 111. As described above, the voltage application circuit 140 is configured to give a time equal to or longer than a predetermined time from the rise start time point to the rise end time point of the voltage applied between the electrode 114a and the movable body 111.

In this way, by applying the vibration device and the method for controlling the vibration device according to the present embodiment to the gyro sensor, it is possible to reduce collision speed when the movable body 111 collides with the stopper 114b of the catch and release mechanism 114. Thereby, it is possible to alleviate impact due to the collision, and it is possible to suppress the generation of foreign matter. As a result, it is possible to suppress a change in the distance between the movable body 111 and the electrode 114a of the catch and release mechanism 114, due to foreign matter, and to perform a proper catching operation. Therefore, it is possible to obtain the gyro sensor having high accuracy and high reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for controlling a vibration device,
the vibration device comprising:
   a movable body capable of vibrating in a first direction and a second direction perpendicular to the first direction;
   a catch and release mechanism capable of catching the movable body that freely vibrates in the first direction, by an electrostatic attractive force, and releasing the caught movable body to freely vibrate the movable body in the first direction; and
   a detection mechanism that detects a predetermined physical quantity based on an amplitude of vibration in the second direction of the movable body based on a Coriolis force acting on the movable body that freely vibrates in the first direction,
the method comprising:
   releasing the caught movable body to freely vibrate the movable body in the first direction by using the catch and release mechanism; and
   catching the movable body freely vibrating in the first direction by using the catch and release mechanism,
wherein the catch and release mechanism is applied with an only increasing applied voltage when catching the movable body, and the applied voltage satisfies tc>td,
where tc is a time from a rise start time point to a rise end time point of the applied voltage for catching the movable body that freely vibrates in the first direction, by the electrostatic attractive force, and td is a period of the free vibration in the first direction of the movable body.

2. A method for controlling a vibration device,
the vibration device comprising:
   a movable body capable of vibrating in a first direction and a second direction perpendicular to the first direction;
   a catch and release mechanism capable of catching the movable body that freely vibrates in the first direction, by an electrostatic attractive force, and releasing the caught movable body to freely vibrate the movable body in the first direction; and
   a detection mechanism that detects a predetermined physical quantity based on an amplitude of vibration in the second direction of the movable body based on a Coriolis force acting on the movable body that freely vibrates in the first direction,
the method comprising:
   releasing the caught movable body to freely vibrate the movable body in the first direction by using the catch and release mechanism; and
   catching the movable body freely vibrating in the first direction by using the catch and release mechanism,
wherein the catch and release mechanism is applied with an only increasing applied voltage when catching the movable body, and the applied voltage satisfies tc te,
where tc is a time from a rise start time point to a rise end time point of the applied voltage for catching the movable body that freely vibrates in the first direction, by the electrostatic attractive force, and to is a time from a fall start time point to a fall end time point during an applied voltage for releasing the movable body caught by the catch and release mechanism to freely vibrate the movable body in the first direction.

3. A method for controlling a vibration device,
the vibration device comprising:
   a movable body capable of vibrating in a first direction; and
   a catch and release mechanism capable of catching the movable body that freely vibrates in the first direction, by an electrostatic attractive force, and releasing the caught movable body to freely vibrate the movable body in the first direction,
the method comprising:
   releasing the caught movable body to freely vibrate the movable body in the first direction by using the catch and release mechanism; and
   catching the movable body freely vibrating in the first direction by using the catch and release mechanism,
wherein the catch and release mechanism is applied with an applied voltage when catching the movable body, and the applied voltage satisfies $Vcmin/td > \Delta V/\Delta t$,
where Vcmin is a minimum voltage necessary for catching the movable body that freely vibrates in the first direction, by the electrostatic attractive force, td is a period of the free vibration in the first direction of the movable body, and $\Delta V/\Delta t$ is an increasing rate of an applied voltage at a moment when the minimum voltage Vcmin is applied between the catch and release mechanism and the movable body.

4. The method according to claim 3,
wherein the movable body is further capable of vibrating in a second direction perpendicular to the first direction; and
the vibration device further comprises a detection mechanism that detects a predetermined physical quantity based on an amplitude of vibration in the second direction of the movable body based on a Coriolis force acting on the movable body that freely vibrates in the first direction.

5. The method according to claim 4,
wherein the applied voltage further satisfies $\Delta V/\Delta t = Vc/te$ or $\Delta V/\Delta t < Vc/te$,
where Vc is a voltage applied to the movable body when the movable body is caught by the catch and release mechanism, and to is a time from a fall start time point to a fall end time point of the applied voltage for releasing the movable body caught by the catch and release mechanism to freely vibrate the movable body in the first direction.

* * * * *

UNITED STATES PATENT AND TRADEMARK OFFICE
CERTIFICATE OF CORRECTION

PATENT NO. : 11,092,440 B2  
APPLICATION NO. : 16/112961  
DATED : August 17, 2021  
INVENTOR(S) : Gando et al.

Page 1 of 1

It is certified that error appears in the above-identified patent and that said Letters Patent is hereby corrected as shown below:

In the Claims

Claim 2, Column 10, Line 3, "tc te" should read --tc $\geq$ te--.

Claim 2, Column 10, Line 7, "to" should read as --tc--.

Claim 5, Column 10, Line 56, "to" should read as --tc--.

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*